(12) United States Patent
Mayes et al.

(10) Patent No.: US 7,345,382 B2
(45) Date of Patent: Mar. 18, 2008

(54) METHOD AND APPARATUS FOR GENERATING SHORT DURATION HIGH VOLTAGE ENERGY PULSES USING INTEGRATED GENERATORS AND ANTENNAE

(76) Inventors: Jonathan R. Mayes, P.O. Box 341149, Austin, TX (US) 78734; William J. Carey, 12978 NW. 90th St., Whitewater, KS (US) 57154

( * ) Notice: Subject to any disclaimer, the term of this patent is extended or adjusted under 35 U.S.C. 154(b) by 233 days.

(21) Appl. No.: 11/169,531

(22) Filed: Jun. 29, 2005

(65) Prior Publication Data

US 2005/0285447 A1    Dec. 29, 2005

Related U.S. Application Data

(60) Provisional application No. 60/583,755, filed on Jun. 29, 2004.

(51) Int. Cl.
*H03K 3/00* (2006.01)
*H03K 3/64* (2006.01)

(52) U.S. Cl. ............................................... 307/106
(58) Field of Classification Search .................. 307/106
See application file for complete search history.

(56) References Cited

U.S. PATENT DOCUMENTS

| 4,274,134 A | * | 6/1981 | Johannessen | ................ 363/59 |
| 5,311,067 A | * | 5/1994 | Grothaus et al. | ............ 307/108 |
| 6,205,200 B1 | * | 3/2001 | Boyer et al. | ................ 378/101 |

* cited by examiner

*Primary Examiner*—Michael Sherry
*Assistant Examiner*—Carlos Amaya
(74) *Attorney, Agent, or Firm*—David Allen Hall (57) ABSTRACT

A method and a small profile apparatus for generating high voltage impulses. Integration of the radiating antenna with the impulse source structure makes possible the small size of the present invention.

2 Claims, 8 Drawing Sheets

METHOD AND APPARATUS FOR GENERATING SHORT DURATION HIGH VOLTAGE ENERGY PULSES USING INTEGRATED GENERATORS AND ANTENNAE

This application claims priority from provisional application No. 60/583,755 filed Jun. 29, 2004.

FIELD OF THE INVENTION

The present invention pertains to the field of electronic pulse generation.

BACKGROUND OF THE INVENTION

A typical high voltage impulse radiating system such as, but not limited to, a Marx generator requires a high voltage impulse and a separate antenna structure. The inherent bulk of such systems generally precludes portability and mobility, which are required features for applications other than basic research.

A Marx generator charges, with a power source, capacitors staged in parallel and then discharges them in series in order to radiate a temporally short burst of voltage the magnitude of which is higher than that of the source. Each stage incorporates a switch designed to close at a predetermined voltage. At closure, the capacitor stages add, or, in the commonly understood industry terminology, "erect," to form an overall capacitance that is equal to the individual stage capacitance divided by the number of stages, and the resultant output voltage is the individual stage voltage multiplied by the number of stages.

SUMMARY OF THE INVENTION

By integrating the impulse source structure and the radiating structure (the antenna), the present invention overcomes the typical impulse radiating system limitation and makes possible applications that require small size. The present invention uses the housing of a pulse generator as its radiating element or antenna.

DETAILED DESCRIPTION OF THE PREFERRED EMBODIMENT

The present invention eliminates the typically separate antenna structure of an impulse radiating system by causing radiation to emanate from the generator housing. One embodiment of the present invention combines two Marx generators of opposite polarity into a dipole configuration that utilizes the housing structure of each generator as one arm of the combined system's antenna. This system is capable of delivering several cycles of RF energy. The resonant frequency, and hence the radiated frequency, is a function of the physical length of the complete device. In essence, the two Marx housings concurrently act as a dipole antenna. The radiating frequency may be changed by physically altering the length of the Marx generator housings.

Figure 1:
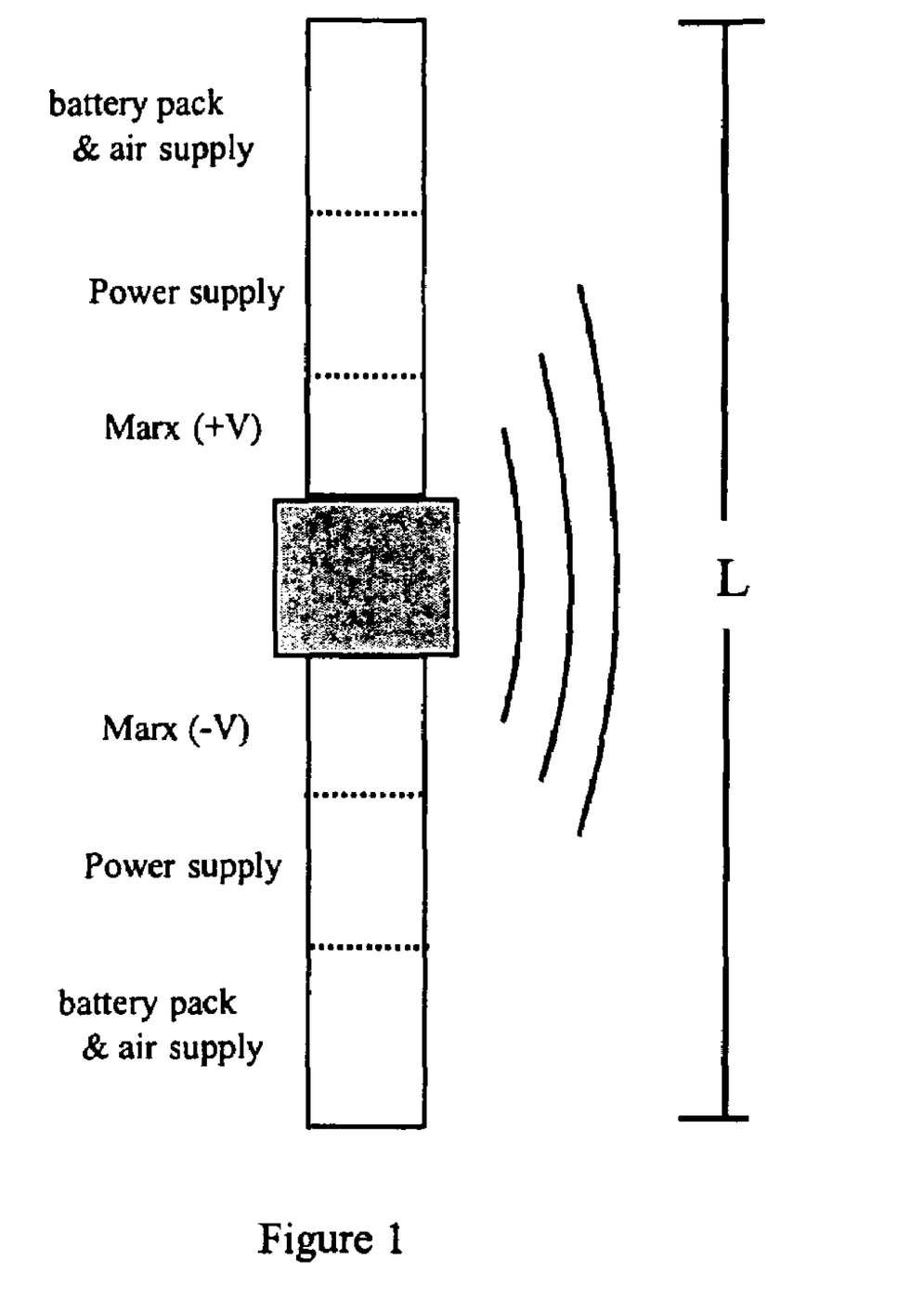
FIG. 1 is an external schematic of a Marx generator dipole antenna system.

The Marx-dipole system is illustrated in FIG. 1. The two generators are collinearly placed with an electrically insulating layer separating their respective conductive housings. Located in this insulating layer is a switch or switches that provide synchronous triggering to both generators. The two generators erect (or fire) simultaneously with low pulse-to-pulse jitter, ensuring that the antenna resonates correctly.

Located in each arm of the dipole antenna is a Marx generator provisioned with external or internal power. The external housings of each generator are of equal length. Each generator is connected to its own housing, with no direct electrical connections being made to the opposite generator as the generator housings are isolated via an electrically insulating medium.

Figure 2:
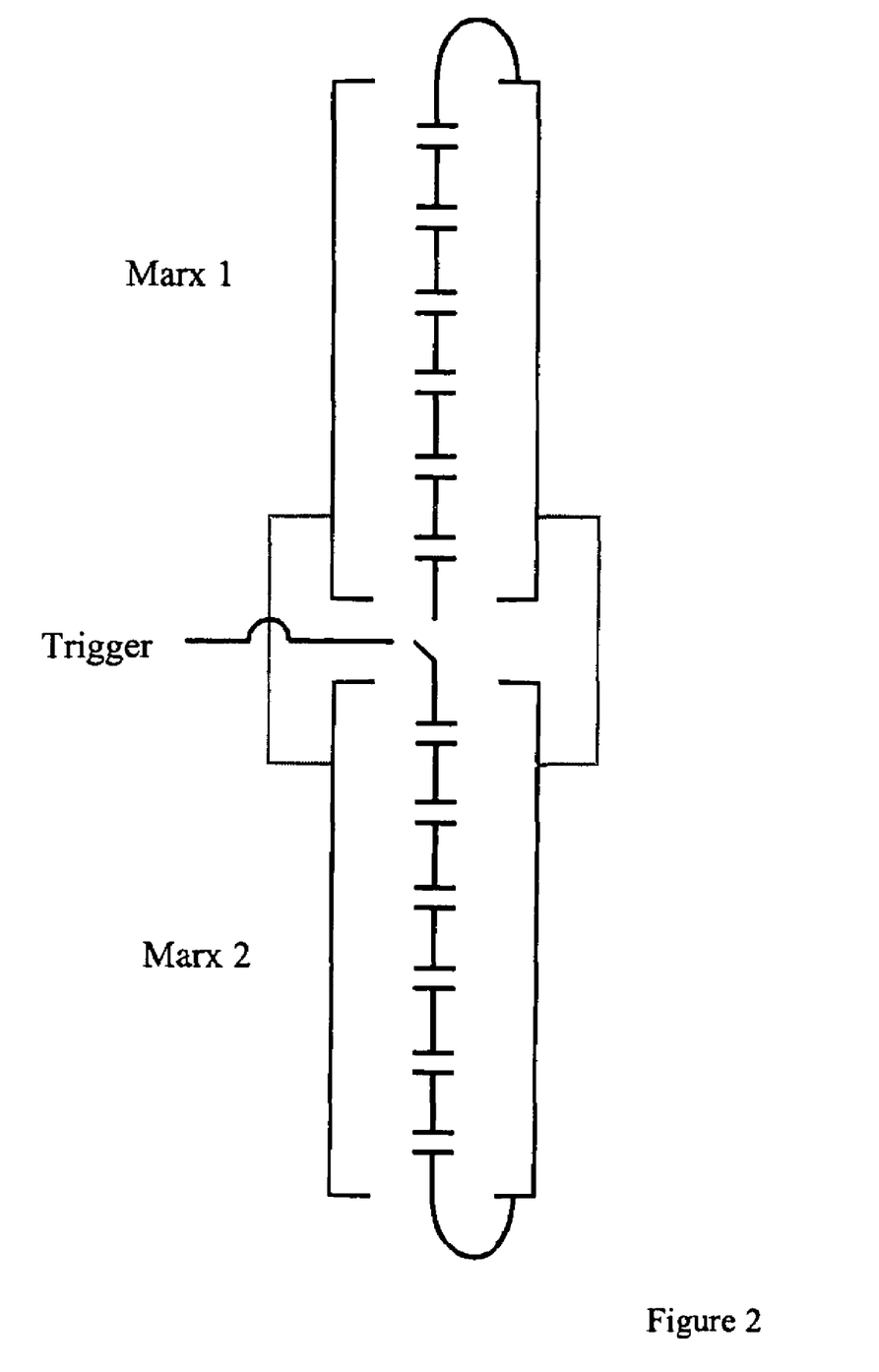
FIG. 2 is an internal schematic of a Marx generator dipole antenna system with a common trigger gap.

As shown in FIG. 2, the two Marx generators, charged with opposite polarities, are fired with a switch or switches that provide synchronous triggering and thus erect away from the center. The output of each generator is electrically connected to its housing. Therefore, the output current of each generator is propagated on the outer surface of the housing before encountering the open circuit at the end of the housing that is located at the center of the overall structure. Because the housings are not connected, the energy from each generator rings between the generator's bank of capacitors and the open circuit. As a result, RF energy radiates as a function of the combined housing structure length.

The two Marx generator housings are physically separated and electrically insulated from each other as shown in FIG. 1. As the Marx generator fires, its current shorts to its housing and propagates the length of the housing and thus emanates RF radiation. The current propagates along the housing until it encounters an open circuit at the insulated termination point of the housing. Then the current is reflected back into the Marx generator whereupon it is discharged a second time. This process repeats and thereby creates a ring down of the Marx generator energy. Because the two Marx generators are identical in construction, opposite in voltage polarity, and simultaneously triggered, the Marx generators ring down in concert. The two housings function in effect as a single antenna, as embodied by the dipole antenna shown in FIG. 1.

Figure 3:
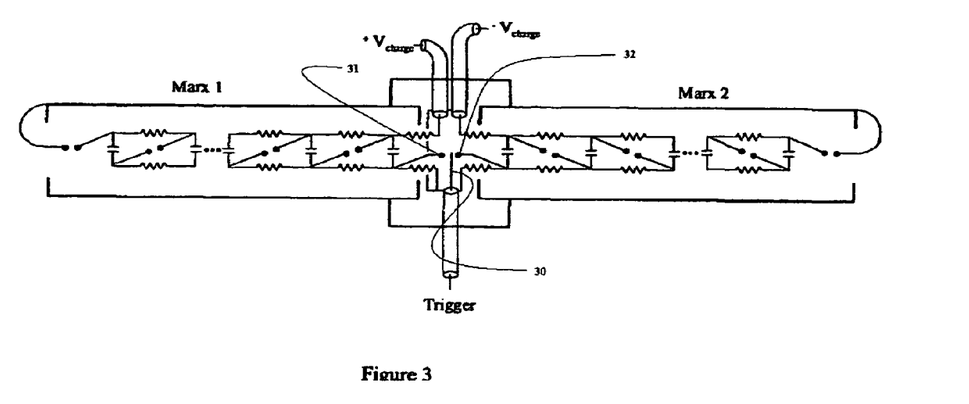
FIG. 3 is a circuit schematic of a Marx generator dipole antenna system with a common trigger gap.

The circuit schematic of the disclosed Marx-dipole system embodiment is shown in FIG. 3. The two Marx generators are charged with opposite-polarity high voltage power supplies. The generators' firing switch (switches), in this case, is (are) a commonly understood field distortion triggered spark gap. With the delivery of a high voltage pulse from the trigger source 30, the trigger gap between electrodes 31 and 32 breaks down and the two Marx generators simultaneously erect.

Figure 4:
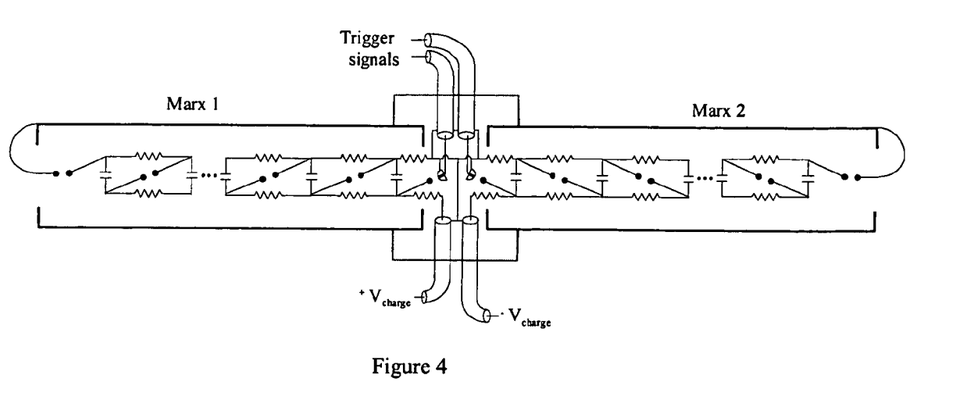
FIG. 4 is a circuit schematic of a Marx generator dipole antenna system with two independent trigger gaps.

An alternative triggering method employs trigatron spark gaps, as shown in FIG. 4. In this embodiment, each generator is triggered with its own trigger, and the generators erect nearly simultaneously.

Figure 5:
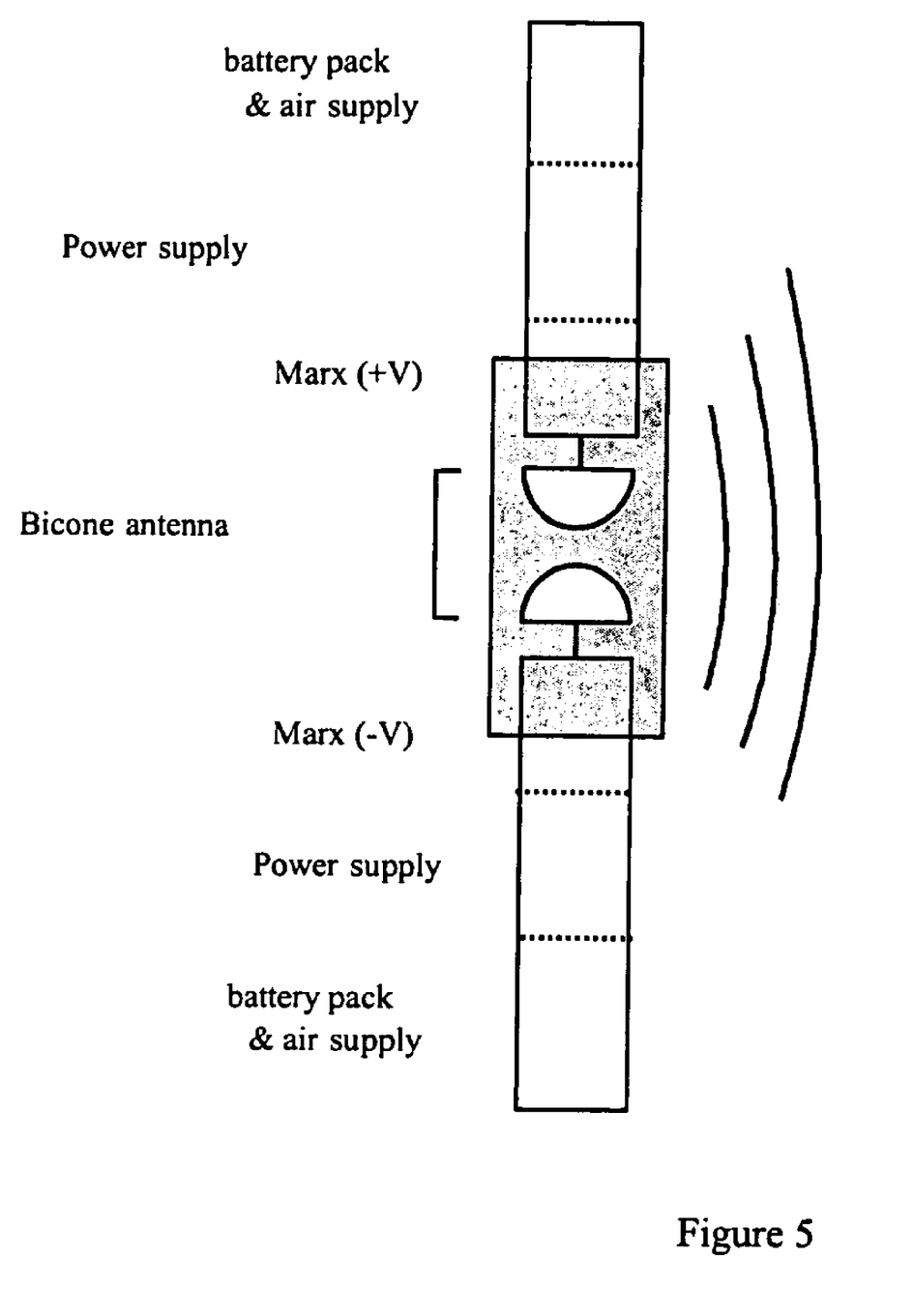
FIG. 5 is a schematic of a Marx generator system using two generators, each charging a conical antenna.

Another alternative embodiment of the present invention, a Marx-biconical system, is physically and operationally similar to the Marx-dipole system, differing in the method of radiation. Such an embodiment is illustrated in FIG. 5. The Marx-biconical system uses two generators of opposite polarity to pulse charge two cones that are electrically isolated from their respective housings. Upon reaching a predetermined charge amplitude, the gaseous gap between the cones breaks down, and RF energy is radiated. The cones can be three-dimensional TEM horn antennae offering efficient impedance matching with the free space medium.

Figure 6A:
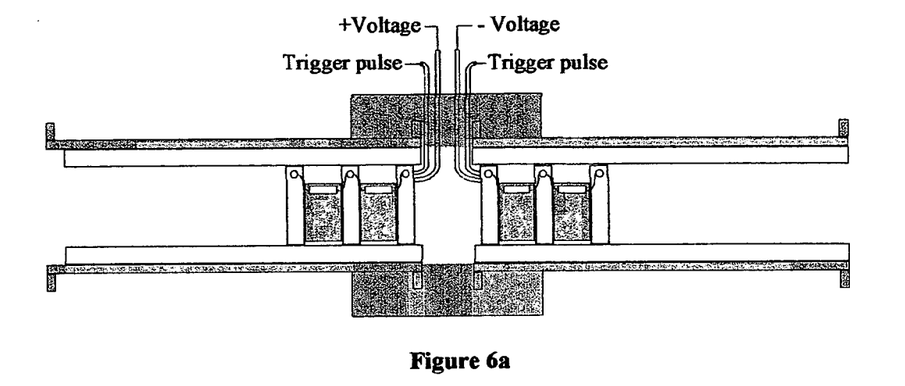
FIG. 6a is a longitudinal cross-section view of the preferred embodiment of a Marx stage.
Figure 6B:
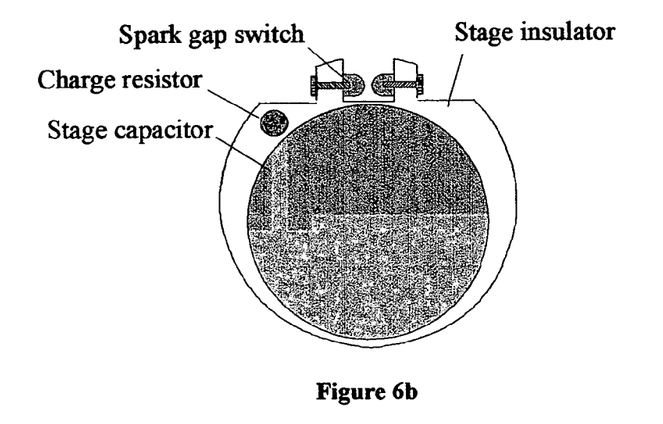
FIG. 6b is a transverse cross-sectional view of the preferred embodiment of a Marx stage.
Figure 7:
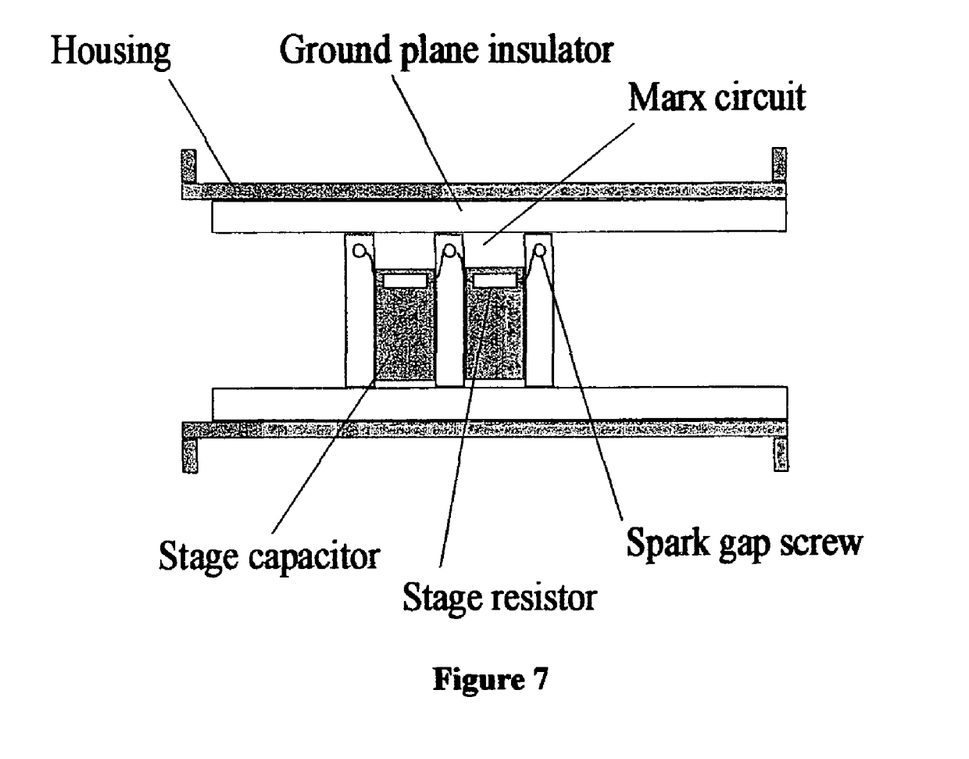
FIG. 7 is a side view of a Marx generator with a housing and a ground plane insulator.

The Marx circuit is compactly fabricated as described by the circuits of FIGS. 3 and 4, and illustrated in cross-sectional views provided by FIGS. 6a and 6b. The side view FIG. 7 illustrates the housing, the ground plane insulator, and two Marx circuit stages. The housing structure is fabricated from aluminum tubing. The ground plane is fabricated from a plastic tube, such as acrylic or nylon. The capacitors used in the prototype come from TDK (UHV-6A), and charging resistors are standard carbon composition, 2 W, with values ranging from a few 10's of kilo-Ohms to a few Mega-Ohms. The DC high voltage and the high voltage trigger pulses are fed into the generator via RG-213 coaxial cable.

Figure 8:
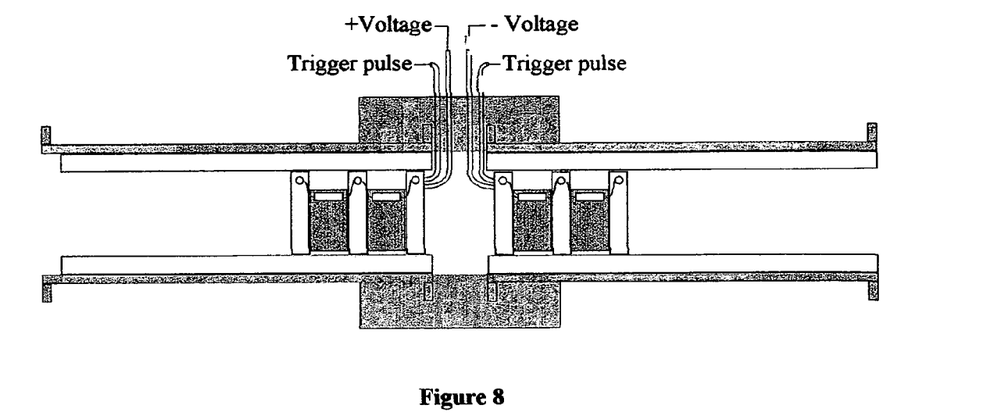
FIG. 8 is a side view of the co-joined generators and electrical feedthroughs.

The generators are co-joined, as illustrated in FIG. 8. An epoxy medium encapsulates several inches of each generator, for mechanical support, and the generator housings are separated by approximately 1 in.

In the preferred embodiment, the Marx generators are fabricated with the following characteristics:

| Parameter | Description | Value | Unit |
|---|---|---|---|
| $V_{open}$ | Open circuit voltage | 300 | kV |
| $V_{ch}$ | Maximum charge voltage | 30 | kV |
| N | Number of stages | 10 | |
| $N_{cap}$ | Number of capacitors per stage | 3 | |
| $C_{stage}$ | Capacitance per stage | 2.7 | nF |
| $C_{marx}$ | Erected capacitance | 270 | pF |
| $L_{marx}$ | Erected series inductance | 500 | nH |
| $Z_{marx}$ | Marx impedance | 43 | Ohm |
| $\eta_{volt}$ | Voltage efficiency (assmuning a 50 Ohm load) | 54 | % |
| $P_{power}$ | Peak power | 520 | MW |
| $E_{marx}$ | Energy stored in Marx | 12 | J |
| $L_{marx}$ | Marx length | 22 | in |
| $D_{marx}$ | Marx diameter | 5 | in |
| Wt | System weight | 30 | lbs |

Specifications, fabrication, and diagnostic testing of the Marx generator and similar generators are described in this present invention application and are described in the following references:

1. Matt B. Lara et al. A modular compact Marx generator design for the Gatlin Marx generator system. IEEE International Pulsed Power Conference Proceedings 2005. (Note: this paper documents development of APELC Marx generator, part number MG15-3C-940 PF).

2. David A. Platts, "Gigawatt Marx Bank Pulser", *Ultra Wideband Radar*: Proceedings of the First Los Alamos Synposium, 1990, CRC Press.

3. M. G. Grothaus, S. L. Moran and L. W. Hardesty, "High Repetition Rate Hydrogen Marx Generator", Proc. of the 20$^{th}$ Power Modulator Symposium, June 1992, Myrtle Beach, S.C.

We claim:

1. A method of radiating RF energy comprising:
   substantially simultaneously erecting a first and a second collinear, opposite-polarity Marx generator, each generator having a housing, and each generator generating short duration high voltage pulses;
   electrically connecting the output of said first generator to its said housing;
   electrically connecting the output of said second generator to its said housing;
   radiating first RF energy from said first generator's housing;
   radiating second RF energy from said second generator's housing; and
   combining said first and second energies.

2. An apparatus for utilizing the method of claim 1.

* * * * *